(12) United States Patent
Moore (10) Patent No.: US 10,691,088 B2
(45) Date of Patent: Jun. 23, 2020

(54) PROGRAMMABLE ACTUATOR SIMULATION CARD

(71) Applicant: The Boeing Company, Chicago, IL (US)

(72) Inventor: Michael Moore, O'Fallon, MO (US)

(73) Assignee: The Boeing Company, Chicago, IL (US)

( * ) Notice: Subject to any disclaimer, the term of this patent is extended or adjusted under 35 U.S.C. 154(b) by 327 days.

(21) Appl. No.: 14/664,296

(22) Filed: Mar. 20, 2015

(65) Prior Publication Data
US 2016/0274554 A1 Sep. 22, 2016

(51) Int. Cl.
*G05B 19/042* (2006.01)
*G01M 17/00* (2006.01)
*G01R 31/28* (2006.01)

(52) U.S. Cl.
CPC ........... *G05B 19/042* (2013.01); *G01M 17/00* (2013.01); *G01R 31/2829* (2013.01); *G01R 31/2846* (2013.01); *G05B 2219/23292* (2013.01)

(58) Field of Classification Search
CPC . G05B 19/042; G01M 17/00; G01R 31/2829; G01R 31/2846; G05G 2219/23292
USPC ........................................................ 700/275
See application file for complete search history.

(56) References Cited

U.S. PATENT DOCUMENTS

| | | | | |
|---|---|---|---|---|
| 2002/0029136 A1* | 3/2002 | Hagiwara | ............. | G01M 13/02 703/8 |
| 2002/0035015 A1* | 3/2002 | Eich | ...................... | B60W 10/02 477/175 |
| 2004/0075020 A1* | 4/2004 | Trikha | .................... | B64C 13/42 244/99.4 |

(Continued)

FOREIGN PATENT DOCUMENTS

| | | |
|---|---|---|
| CN | 1945255 A | 4/2007 |
| CN | 101874313 A | 10/2010 |

(Continued)

OTHER PUBLICATIONS

Pierre-Yves Crepin, Richard Kress; Model Based Fault Detection for an Aircraft Actuator; Darmastadt University of Technology; Petersenstr. 30, D-64287 Darmstadt, Germany; ICAS 2000 Congress; p. 631.1-631.8.

(Continued)

*Primary Examiner* — Robert A Cassity
(74) *Attorney, Agent, or Firm* — Miller, Matthias & Hull LLP (57) ABSTRACT

An actuator simulator card that is programmable with one or more actuator simulation models is provided. The actuator simulator card may include a first interface configured to communicate with a programmable computer, a second interface configured to communicate with an actuator controller, and a simulation module in communication with each of the first interface and the second interface. The simulation module may be configured to receive at least one actuator simulation model corresponding to at least one actuator from (Continued)

the first interface, receive excitation signals and command signals for operating the actuator from the second interface, and determine simulated feedback signals based on the excitation signals, the command signals, and the actuator simulation model.

19 Claims, 4 Drawing Sheets

(56) References Cited

U.S. PATENT DOCUMENTS

| | | | | |
|---|---|---|---|---|
| 2006/0067024 | A1* | 3/2006 | Chemisky | F02D 41/2096 361/139 |
| 2010/0250092 | A1* | 9/2010 | Schemmer | H02N 2/0075 701/102 |
| 2011/0295391 | A1* | 12/2011 | Schneider | G05B 19/0426 700/87 |
| 2015/0121148 | A1* | 4/2015 | Hyodo | G06F 11/3688 714/38.1 |

FOREIGN PATENT DOCUMENTS

| | | |
|---|---|---|
| CN | 102588211 A | 7/2012 |
| CN | 102684222 A | 9/2012 |
| CN | 102821531 A | 12/2012 |
| CN | 102867221 A | 1/2013 |
| CN | 103335831 A | 10/2013 |
| CN | 103995473 A | 8/2014 |
| EP | 1180673 A2 | 2/2002 |
| JP | 2002122222 A | 4/2002 |
| JP | 2004264974 A | 9/2004 |

OTHER PUBLICATIONS

Canadian Examination Report received in counterpart Canadian Patent Application No. 2,917,240; dated Nov. 14, 2018.
Office Action for related Chinese Application No. 2016-101649437; report dated Aug. 20, 2019.
Office Action for related Japanese Application No. 2016-039642; report dated Feb. 28, 2020.
Office Action for related Chinese Application No. 2016101649437; report dated Mar. 9, 2020.

* cited by examiner

PROGRAMMABLE ACTUATOR SIMULATION CARD

TECHNICAL FIELD

The present disclosure relates generally to testing environments for actuators and actuator controllers, and more particularly, to apparatus, systems and methods for implementing a programmable actuator simulation card.

BACKGROUND

Actuators as well as actuator controllers are implemented in a wide variety of different applications, including those related to flight control systems, automotive systems, construction equipment, medical instrumentation, and other industrial applications. Prior to implementation, actuators and associated actuator controllers are tested for faults, error conditions or other deficiencies in order to ensure proper functionality. With respect to flight control systems, for instance, testing may be performed by connecting each of an electrohydraulic actuator and an associated flight control computer to a programmable computer, and observing the operational characteristics of the flight control computer and/or the operational characteristics of the actuator in response to test commands issued from the flight control computer. Conducting such tests through a range of positions, motions, and other actions of the actuator may help identify any issues that may exist within the actuator and/or within the software programmed on the flight control computer.

There are however some limitations to these conventional test procedures. Specifically, while both the actuator and the actuator controller must be connected in order to adequately test either component, both components are not always concurrently available for testing. This results in unwanted delays in testing, which can further cause delays in the final implementation or other detrimental scheduling impacts. Additionally, conventional test systems rely on substantially analog interface circuits and generally fixed hardware-based filters, modulators, demodulators, and the like, in order to connect the programmable computer to the actuator being tested. Moreover, the analog nature of these circuits restricts testing to only those specific types of actuators that are compatible to the given hardware, such as in terms of output frequency, gain, and the like. As such, different hardware is required to test different types of actuators, which tends to make the overall test procedure inconvenient, cumbersome and slow.

Accordingly, there is a need for improved techniques for testing actuators and actuator controllers which are not restricted by the aforenoted limitations and provide for more adaptable and simplified means for testing a wider variety of actuators.

SUMMARY OF THE DISCLOSURE

In accordance with one aspect of the present disclosure, an actuator simulator is provided. The actuator simulator may include a first interface configured to communicate with a programmable computer, a second interface configured to communicate with an actuator controller, and a simulation module in communication with each of the first interface and the second interface. The simulation module may be configured to receive at least one actuator simulation model corresponding to at least one actuator from the first interface, receive excitation signals and command signals for operating the actuator from the second interface, and determine simulated feedback signals based on the excitation signals, the command signals, and the actuator simulation model.

In accordance with another aspect of the present disclosure, an actuator simulation system is provided. The actuator simulation system may include a programmable computer configured to source one or more of a plurality of actuator simulation models corresponding to one or more actuators, an actuator controller configured to control one or more actuators, and an actuator simulator having a first interface for communicating with the programmable computer and a second interface for communicating with the actuator controller. The actuator simulator may be configured to receive at least one actuator simulation model through the first interface, receive excitation signals and command signals through the second interface, and determine simulated feedback signals based on the excitation signals, the command signals, and the actuator simulation model.

In accordance with a further aspect of the present disclosure, a method of simulating an actuator is provided. The method may include providing a first interface for communicating with a programmable computer having one or more actuator simulation models preprogrammed therein, providing a second interface for communicating with an actuator controller having an operational program installed therein, selecting at least one of the actuator simulation models corresponding to the actuator to be simulated, operating the actuator controller to issue excitation signals and command signals, and determining simulated feedback signals based on the excitation signals, the command signals, and the selected actuator simulation model.

The features, functions and advantages that have been discussed can be achieved independently in various embodiments or may be combined in yet other embodiments, further details of which can be seen with reference to the following description and drawings.

DETAILED DESCRIPTION

Although the following sets forth a detailed description of numerous different embodiments, it should be understood that the legal scope of protection is defined by the words of the claims set forth at the end of this patent. The detailed description is to be construed as exemplary only and does not describe every possible embodiment since describing every possible embodiment would be impractical, if not impossible. Numerous alternative embodiments could be implemented, using either current technology or technology developed after the filing date of this patent, which would still fall within the scope of the claims defining the scope of protection.

It should also be understood that, unless a term is expressly defined herein, there is no intent to limit the meaning of that term, either expressly or by implication, beyond its plain or ordinary meaning, and such term should not be interpreted to be limited in scope based on any statement made in any section of this patent other than the language of the claims. To the extent that any term recited in the claims at the end of this patent is referred to herein in a manner consistent with a single meaning, that is done for sake of clarity only so as to not confuse the reader, and it is not intended that such claim term be limited, by implication or otherwise, to that single meaning.

Figure 1:
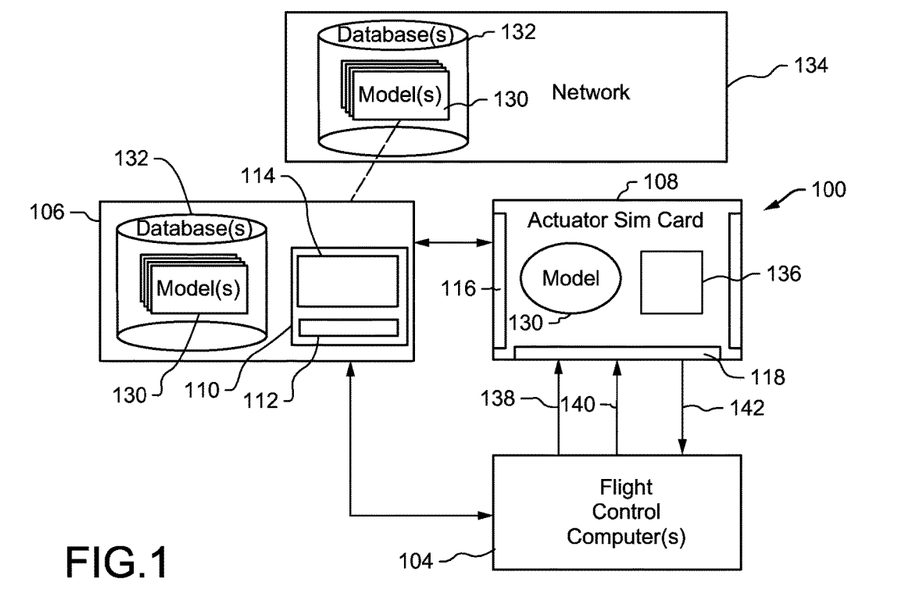
FIG. 1 is a schematic illustration of an exemplary actuator simulation system for testing an actuator controller.
Figure 2:
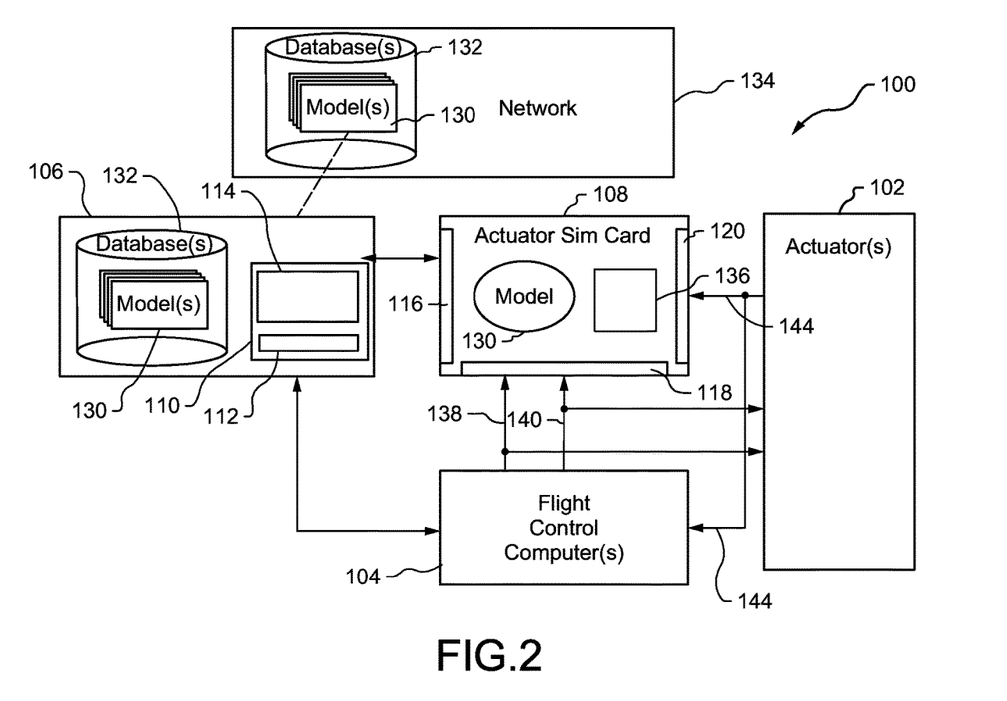
FIG. 2 is a schematic illustration of another exemplary actuator simulation system for testing an actuator.

Referring now to FIGS. 1 and 2, exemplary embodiments of an actuator simulation system 100 that may be used to test an actuator 102 and/or an actuator controller 104 are provided. An actuator 102 under test may include any one or more of a variety of different actuators commonly used in the art, such as, but not limited to, electrohydraulic actuators, mechanical actuators, pneumatic actuators, piezoelectric actuators, electrical actuators, and the like. The actuator controller 104 may represent, for example, a flight control computer that is preprogrammed or programmable with an operational flight program, or any other controller, processor, computing device, or the like, that is preconfigured or configurable to issue the appropriate signals for operating one or more connected actuators 102. As shown, the actuator simulation system 100 may generally include a programmable computer 106, an actuator simulator card 108, and at least one actuator controller 104 coupled thereto. In its simplest form, the programmable computer 106 may include any one or more of a variety of conventionally available computing devices which may be configured to provide a user interface 110 having one or more input devices 112 and output devices 114 for interacting with a test operator, and preprogrammed to conduct functionality tests on connected actuators 102 and/or actuator controllers 104.

Depending on the desired mode of testing, the actuator simulator card 108 and the overall actuator simulation system 100 may be arranged in one of the at least two arrangements shown in FIGS. 1 and 2. To test the functionality of an actuator controller 104, for example, the actuator simulation system 100 may be configured as shown in FIG. 1, in which the actuator simulator card 108 provides a first interface 116 configured to communicate with the programmable computer 106, and a second interface 118 configured to communicate with the actuator controller 104. To test the proper functionality of an actuator 102, for example, the actuator simulation system 100 may be configured as shown in FIG. 2, in which the actuator simulator card 108 additionally provides a third interface 120 configured to communicate with the actuator 102. In either arrangement, the actuator simulator card 108 may be configured to simulate an actual actuator 102, or more particularly, to receive input signals supplied by the actuator controller 104 as well as generate output signals that are responsive to the input signals and emulate those of an ideal actuator 102. The actuator simulator card 108, thus, in FIG. 1 enables testing of the actuator controller 104 without needing to connect to an actual actuator 102. Alternatively, in FIG. 2, the actuator simulator card 108 enables testing of an actual actuator 102 by comparing actual actuator outputs to simulated actuator outputs, which can further be used to derive or observe relative timing, delays, errors, or any other trait of the of the actuator controller 104 and/or the connected actuator 102.

Figure 3:
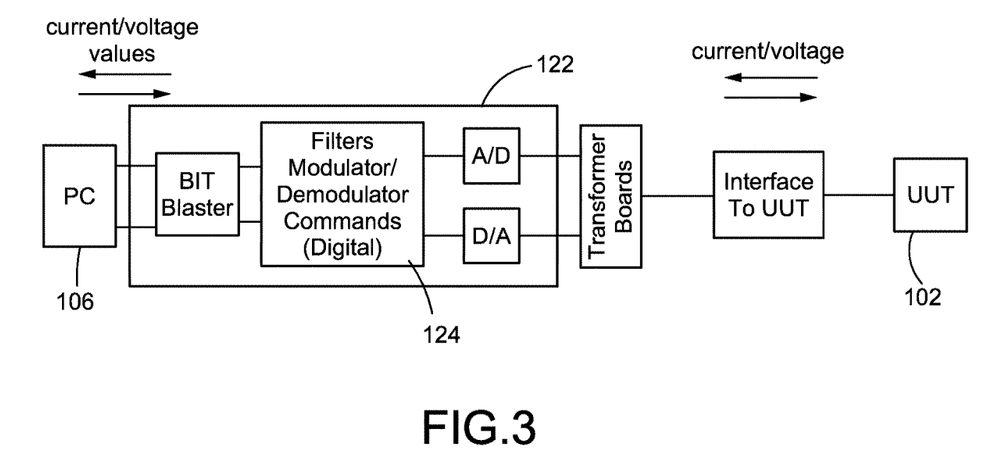
FIG. 3 is a diagrammatic illustration of a programmable interface circuit of the present disclosure.
Figure 4:
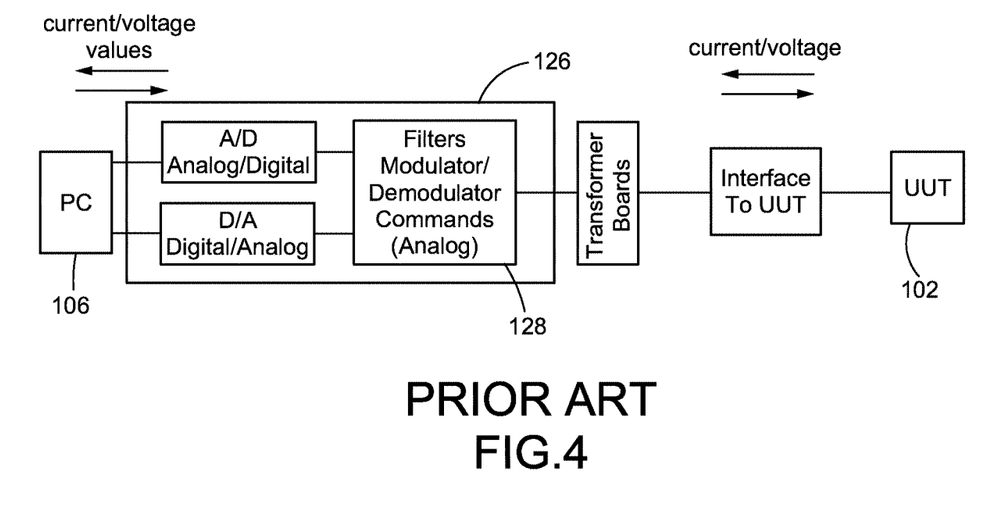
FIG. 4 is a diagrammatic illustration of a non-programmable interface circuit of the prior art.

In addition, the actuator simulation system 100 in either of the embodiments of FIGS. 1 and 2 may be programmable and adapted to different types of actuators 102. When testing functionality of an actual actuator 102, the actuator simulation system 100 may provide a configurable or programmable interface 122 between the programmable computer 106 and the connected actuator 102 as shown for example in FIG. 3. More specifically, the programmable interface 122 may employ a digital signal processor 124 or other digital signal processing means to implement the appropriate filters, modulators, demodulators, and any other components needed to communicate with the attached actuator 102. Furthermore, the programmable interface 122 may be easily reprogrammed to similarly accommodate the output frequencies, gains, and other parameters of a variety of other types of actuators 102 and actuator controllers 104. For instance, the actuator simulator card 108, or the programmable interface 122 and digital signal processor 124 thereof, may be reprogrammed with any one of a number of different predefined actuator simulation models 130, each corresponding to one or more sets of actuators 102 sharing common output characteristics. This is in contrast to the generally fixed nature of prior art interface circuits 126, as shown for example in FIG. 4, which employ analog signal processing circuitry 128 to implement filters, modulators, demodulators, and the like, that are only compatible with and hardware-restricted to a single type of actuator 102.

Turning back to the embodiments of the actuator simulation system 100 of FIGS. 1 and 2, the programmable computer 106 may be provided with one or more databases 132 having one or more actuator simulation models 130 locally stored therein. Additionally or optionally, the programmable computer 106 may be configured to communicate with one or more remote databases 132 via one or more networks 134 associated therewith. The programmable computer 106 may communicate with local and/or remote databases 132 to retrieve the appropriate actuator simulation models 130 which correspond to the given actuator 102. For example, each actuator simulation model 130 may include a different set of instructions that is executable by a simulation module 136 within the actuator simulator card 108 to simulate the response or electrical output of the given actuator 102. The appropriate actuator simulation model 130 to be used may be selected manually by the test operator or automatically selected based on predefined rule sets provided within the programmable computer 106. Once the selected actuator simulation model 130 is retrieved from the database 132, the programmable computer 106 may upload or install the selected actuator simulation model 130 onto the actuator simulator card 108 via the first interface 116 to prepare for testing.

Once the appropriate actuator simulation model 130 is installed onto the actuator simulator card 108, an actuator controller 104 may be tested according to the arrangement provided in FIG. 1. Through the user interface 110 of the programmable computer 106, for example, the test operator may operate or instruct the actuator controller 104 to issue the appropriate commands for engaging the actuator simulator card 108 as if it were a real actuator 102. While other forms of communication or commands may be feasible, the actuator controller 104 in FIG. 1 may issue commands generally in the form of excitation signals 138, such as electrical reference signals upon which corresponding feedback may be based, and command signals 140, such as electrical signals indicative of a desired change in position, a desired rate of change in position, or any other desired action by the actuator 102. The actuator controller 104 may further transmit the excitation signals 138 and the command signals 140 to the simulation module 136 of the actuator simulator card 108 via the second interface 118 to invoke a response or feedback therefrom. More particularly, actuators 102 may typically supply feedback signals 142 such as in the form of electrical signals indicative of the actual position, response rate, error rate, or any other relevant parameter of the actuator 102.

Based on the excitation signals 138 and the command signals 140 received from the actuator controller 104, and based on the actuator simulation model 130, the simulation module 136 may generate simulated feedback signals 142 that emulate those of an ideal actuator 102. Additionally or optionally, the simulation module 136 may also be configured to emulate actuators 102 with a planned defect to observe the response of the actuator controller 104 to such error conditions. During testing, the simulation module 136 may transmit the simulated feedback signals 142 to the actuator controller 104 via the second interface 118 to complete the closed loop therewith. The test operator may conduct various test routines on the actuator controller 104 through different ranges of actuator positions, motions, and other actions, and monitor for deviations or errors within the actuator controller 102 or the software programmed thereon. Moreover, the test operator may observe the operating characteristics of the actuator controller 104, for example, through the user interface 110 of the programmable computer 106. Because the response or feedback provided by the simulation module 136 is predetermined and known, unanticipated faults or error conditions may be more readily attributed to the actuator controller 104 or the software thereof. Optionally, or in other modifications, any part of the test routine may be automatically performed by the programmable computer 106 according to preprogrammed instructions.

When testing an actuator 102, according to the arrangement of FIG. 2 for example, the simulation module 136 may use the actuator simulation models 130 as references to which actual feedback signals 144 from the connected actuator 102 are compared. In particular, an actuator 102 may be connected to each of the actuator controller 104 and to the third interface 120 of the simulation module 136. Commands that are issued by the actuator controller 104, such as excitation signals 138 and command signals 140, may be simultaneously transmitted to each of the simulation module 136 and the connected actuator 102. In response, the actuator 102 may perform the requested actions, and supply actual feedback signals 144 indicative of the resulting position, response rate, error rate, or any other relevant parameter thereof. For certain types of actuators 102, such as electrohydraulic actuators commonly used in flight control systems, for example, the actual feedback signals 144 may include feedback from linear variable differential transformers (LVDTs) corresponding to the degree to which a main control valve (MCV) of the actuator 102 is opened. Moreover, the state of the MCV may be indicative of the amount of hydraulic fluid flowing through the actuator 102, and thus, further indicative of the resulting displacement and/or rate of displacement of the associated flight surface. The actual feedback signals 144 may also include actual measurements of the position of, for instance, an actuator ram, through resolver-type outputs, LVDT-type outputs, or the like. The connected actuator 102 may also output other types of feedback, such as actuator temperature, hydraulic pressure, and the like.

The simulation module 136 in FIG. 2 may correspondingly determine or generate simulated feedback signals 142 based on the installed actuator simulation model 130 and the excitation signals 138 and command signals 140 received directly from the actuator controller 104. The simulated feedback signals 142 may similarly be indicative of the resulting position, response rate, error rate, or other relevant parameters that are representative of an ideal and properly functioning actuator 102. As shown in FIG. 2, the actual feedback signals 144 may be supplied to the actuator controller 104 so as to complete the control loop therewith, and also simultaneously supplied to the simulation module 136 via the third interface 120 for monitoring. In turn, the simulation module 136 may receive the actual feedback signals 144 from the connected actuator 102, and provide benchmark comparisons with the simulated feedback signals 142 that are internally generated within the actuator simulator card 108. Comparisons between the simulated feedback signals 142 and the actual feedback signals 144, or deviations therebetween, may be transmitted to the programmable computer 106 by the simulation module 136 in the form of characterization data, or the like, via the first interface 116.

Furthermore, the programmable computer 106 may be programmed to convert the characterization data into corresponding graphical displays or representations that are indicative of the behaviors of one or more connected actuators 102, one or more actuator controllers 104, and/or the actuator simulation system 100 in general. The programmable computer 106 may further present the graphical displays or representations to the test operator via an output device 114 thereof. For each test conducted, for example, the programmable computer 106 may be configured to arrange and present the commands and/or positions that were requested by the actuator controller 104, the ideal or expected actuator response, as well as the actual or resulting position and/or action of the connected actuator 102. The programmable computer 106 may also be configured to accommodate other types of actuators 102 and/or actuator controllers 104 which may communicate using different signal types, and/or other forms of characterization data. Additionally, the programmable computer 106 may be configured to present such information to the test operator in the form of customizable tables, charts, plots, graphical views, schematic views, or the like. The information presented may also be updated at predefined intervals or essentially in real-time. In still further modifications, the programmable computer 106 may be configured to automatically store the characterization data in memory for later retrievable by the test operator.

Figure 5:
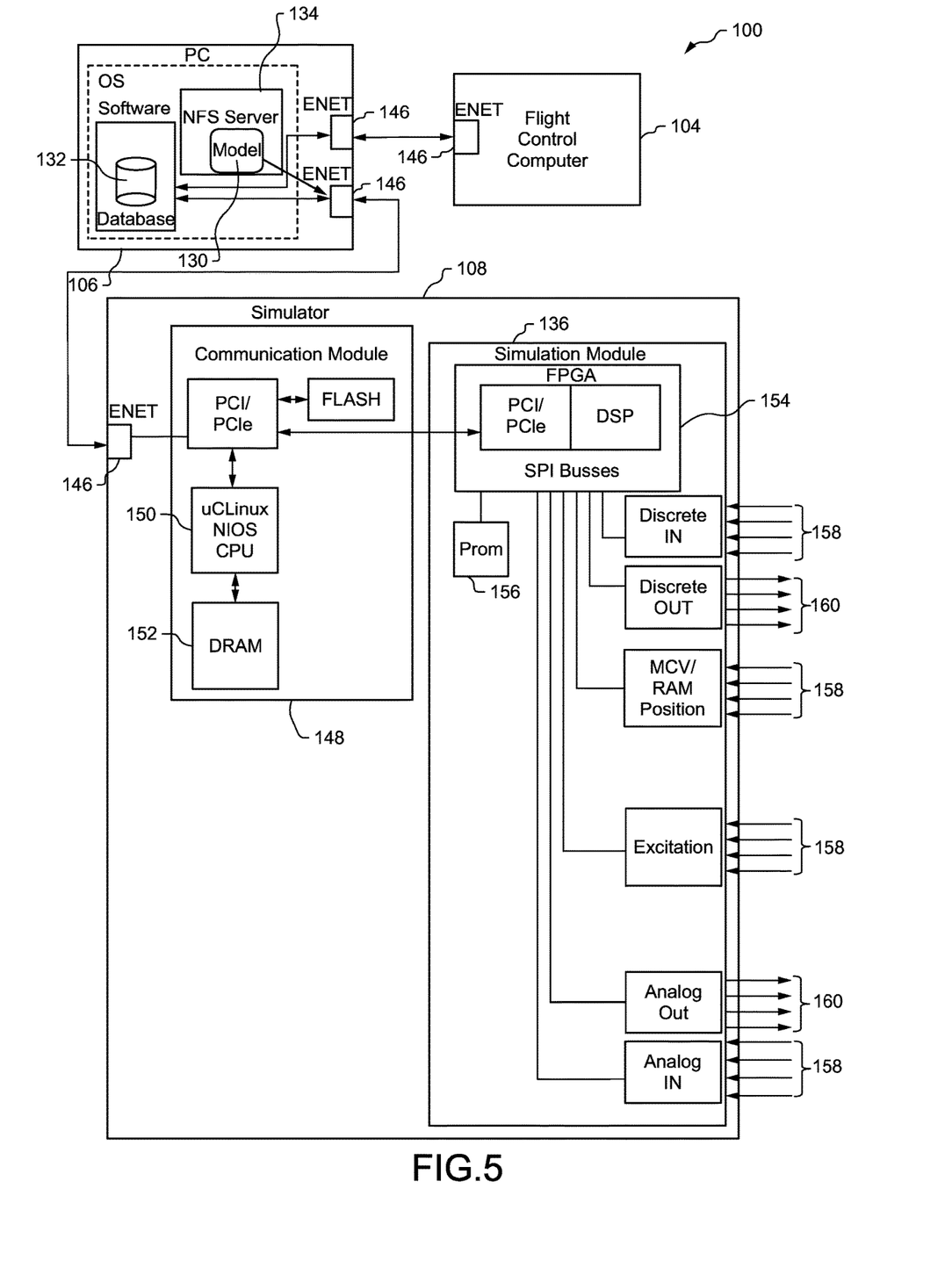
FIG. 5 is a schematic illustration of yet another exemplary actuator simulation system constructed in accordance with the teachings of the present disclosure.

Referring now to FIG. 5, one exemplary configuration of the actuator simulation system 100 as specifically applied to flight control systems is provided. Similar to previous embodiments, the actuator simulation system 100 may generally include one or multiple flight control computers 104, a programmable computer 106 and an actuator simulator card 108. More specifically, the flight control computer 104 may be preprogrammed or programmable with software, such as an operational flight program, or the like, that is configured to control one or more actuators 102 adapted to modify flight control surfaces, such as rudders, elevators, telescopes, ailerons, stabilizers, and the like. The programmable computer 106 may be programmed with an operating system and/or software which enables the programmable computer 106 to retrieve one or more actuator simulation models 130 from a database 132 that is locally accessible from within the programmable computer 106 and/or remotely accessible such as through a network 134, or the like. Moreover, each of the actuator simulation models 130 may be capable of simulating the output response of a corresponding type of actuator 102. The programmable computer 106 may further provide communication means 146, such as slots, receptacles, connectors, ports, or any other suitable means for linking external accessory devices, such as the flight control computer 104 and the actuator simulator card 108, to a system bus thereof.

Still referring to FIG. 5, the actuator simulator card 108 may generally include a communication module 148, and as in previous embodiments, a simulation module 136. As shown, the communication module 148 may be implemented using a processing unit 150 and associated memory 152 configured to manage the transfer of information through the communication means 146 between the simulation module 136 and the programmable computer 106. The simulation module 136 may be implemented using a programmable device 154, such as a field programmable gate array (FPGA), or any other device that is reprogrammable and reconfigurable to implement different digital signal processes according to different actuator simulation models 130, as well as a programmable memory 156 associated therewith. The simulation module 136 may additionally include a plurality of inputs 158 adapted to receive, for example, the excitation signals 138 and the position command signals 140 from the flight control computer 104, and actual feedback signals 144 if there is a connected actuator 102 being tested. The inputs 158 may also receive other measurements or traits from the actuator 102, such as temperature, hydraulic pressure, and the like. The simulation module 136 may further include a plurality of outputs 160 adapted to transmit, for example, any simulated feedback signals 142 to the flight control computer 104 during testing of the operational flight program therein and/or commands to one or more actuators 102 where applicable.

Figure 6:
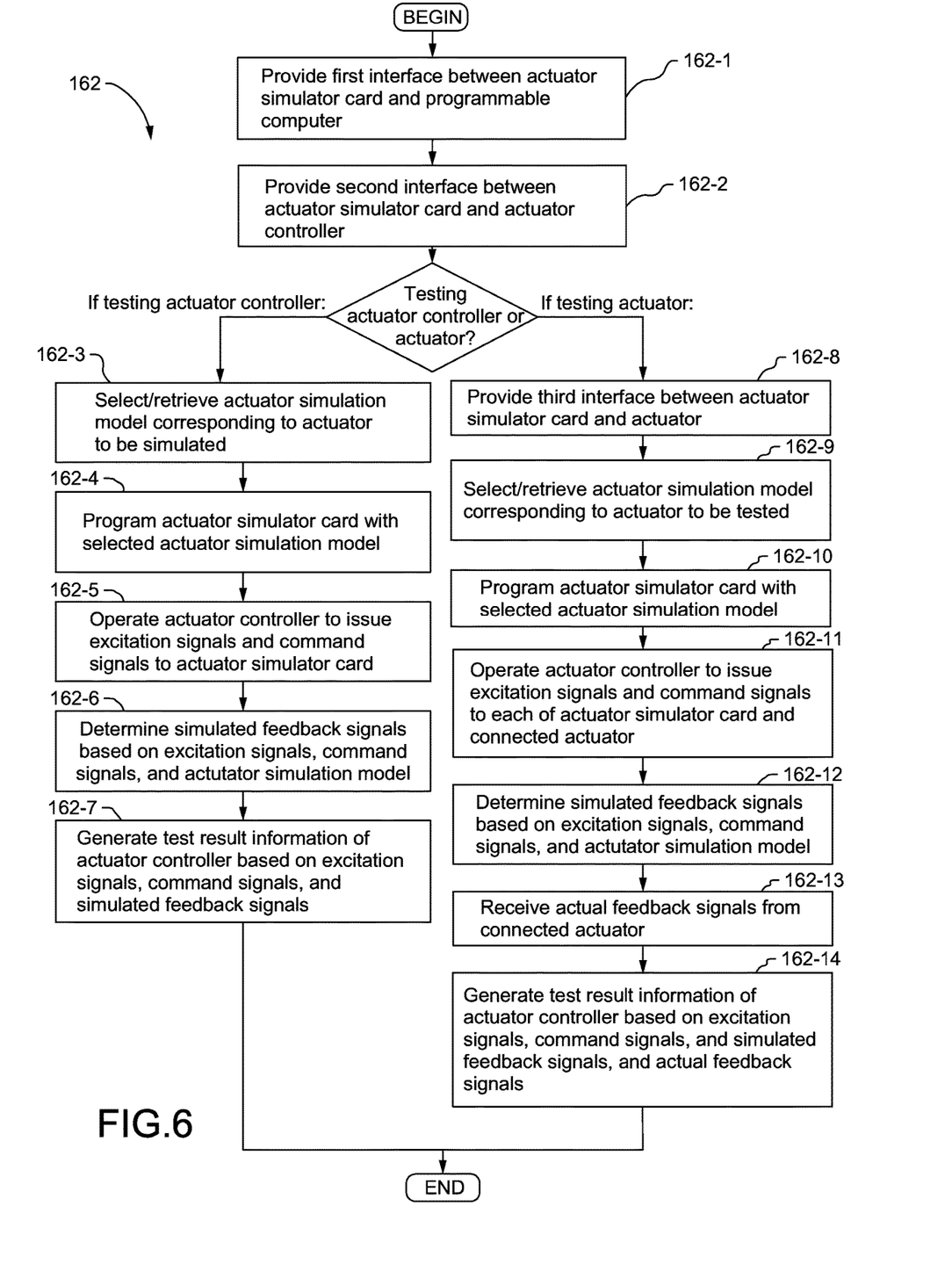
FIG. 6 is a diagrammatic illustration of an exemplary method that may be used to provide an actuator simulation system for testing an actuator or an actuator controller.

Turning now to FIG. 6, one exemplary method 162 of providing the actuator simulation system 100 and simulating an actuator 102 is diagrammatically provided. More particularly, the method 162 of FIG. 6 may be used to enable testing of an actuator 102 and/or an actuator controller 104 with the aid of an actuator simulator card 108 that is configurable with different actuator simulation models 130. As shown in block 162-1, the method 162 may initially provide for a first interface 116 between the actuator simulator card 108 and a programmable computer 106. Block 162-2 of the method 162 may further provide for a second interface 118 between the actuator simulator card 108 and the actuator controller 104. Depending on the type of testing that is desired, other arrangements of the actuator simulation system 100 and/or other types of interfaces may be provided to the actuator simulator card 108. For example, if the functionality of an actuator controller 104 is not to be tested, the first interface 116 and the second interface 118 may suffice and testing can proceed without connecting an actuator 102 according to block 162-3 in the method 162 shown. If, however, the functionality of an actuator 102 is to be tested, a third interface 120 may be necessary for connecting to the actuator 102 according to block 162-8 in the method 162 shown.

If the actuator controller 104 is the unit under test, the actuator simulation model 130 corresponding to the actuator 102 to be simulated may be selected and/or retrieved according to block 162-3. For instance, using the user interface 110 of the programmable device 106, a test operator may access local and/or remote databases 132 containing predefined actuator simulation models 130 corresponding to different types of actuators 102. The test operator may then select the actuator simulation model 130 which most closely simulates the responses and behaviors of the types of actuators 102 that are compatible with the actuator controller 104 to be tested, and program the actuator simulator card 108 with the selected actuator simulation model 130 through the first interface 116 according to block 162-4. Once the actuator simulation model 130 is installed onto the actuator simulator card 108, the actuator controller 104 may be operated, such as via the programmable computer 106, to issue test commands, such as excitation signals 138, position command signals 140, and the like, to the actuator simulator card 108 according to block 162-5.

Furthermore, according to block 162-6 of FIG. 6, simulated feedback signals 142 may be determined by the actuator simulator card 108 based on the excitation signals 138, the command signals 140 and the installed actuator simulation model 130. Specifically, the actuator simulator card 108 may refer to the actuator simulation model 130 programmed therein, or internally apply the excitation signals 138 and the command signals 140 to the installed actuator simulation model 130, to output simulated feedback signals 142 that emulate the ideal response of a working actuator 102. Additionally or optionally, the actuator simulation model 130 may be configured to emulate the response of an actuator 102 with a planned or predefined defect, thereby allowing the test operator to observe the ability of the actuator controller 104 to detect and respond to the planned error. Once the simulated feedback signals 142 are transmitted back to the actuator controller 104 and the closed loop therewith is completed, the response or behavior of the actuator controller 104 may be tracked and monitored from the programmable computer 106 in predefined intervals or virtually in real-time.

According to block 162-7 of the method 162 of FIG. 6, test result information relating to the actuator controller 104 may be generated, for instance, by the programmable computer 106 based on data captured through its direct connection with the actuator controller 104. More specifically, the programmable computer 106 may be programmed to generate test results in the form of graphical displays or representations that are indicative of the behavior of the actuator controller 104, and present the graphical displays or representations to the test operator via an output device 114 thereof. The test results may include information relating to the excitation signals 138 and command signals 140 that were issued by the actuator controller 104, the simulated feedback signals 142 that were output by the actuator simulator card 108, the actual response of the actuator controller 104 to the simulated feedback signals 142, the expected response of the actuator controller 104 to the simulated feedback signals 142, any errors or deviations that were detected in the response of the actuator controller 104, and the like. In further modifications, the programmable computer 106 may provide debugging features which help the test operator identify those sections of code running on the actuator controller 104 in need of attention.

Alternatively, if the actuator 102 is the unit under test, the method 162 may provide for a third interface 120 between the actuator simulator card 108 and the actuator 102 according to block 162-8 of FIG. 6. Furthermore, the actuator simulation model 130 corresponding to the actuator 102 to be tested may be selected and/or retrieved according to block 162-9. As in previous embodiments, a test operator may access the actuator simulation models 130 from local and/or remote databases 132 containing predefined actuator simulation models 130 corresponding to different types of actuators 102. The test operator may select the appropriate actuator simulation model 130 corresponding to the connected actuator 102 under test, and program the actuator simulator card 108 through the first interface 116 according to block 162-10. Once the actuator simulation model 130 is installed onto the actuator simulator card 108, the actuator controller 104 may be operated to issue test commands, such as excitation signals 138, position command signals 140, and the like, to each of the actuator simulator card 108 and the connected actuator 102 according to block 162-11.

According to block 162-12 of FIG. 6, simulated feedback signals 142 may be determined by the actuator simulator card 108 based on the excitation signals 138, the command signals 140 and the installed actuator simulation model 130. In particular, the actuator simulator card 108 may refer to the actuator simulation model 130 programmed therein to determine the simulated feedback signals 142 that emulate the ideal response of a working actuator 102. Actual feedback signals 144 that are output by the connected actuator 102 may be concurrently received in accordance with block 162-13. More specifically, the actual feedback signals 144 may be output by the actuator 102 in response to the excitation signals 138 and command signals 140 issued by the actuator controller 104. Furthermore, the actuator simulator card 108 may be configured to track the simulated feedback signals 142 in parallel to the actual feedback signals 144 to facilitate comparisons therebetween. Still further, the response or behavior of the connected actuator 102 may be tracked and monitored by the programmable computer 106 and/or the actuator simulator card 108 in predefined intervals or virtually in real-time.

In addition, according to block 162-14 of FIG. 6, test result information relating to the connected actuator 102 may be generated by the programmable computer 106 based on data captured through its connections with the actuator controller 104 and the actuator simulator card 108. Specifically, the programmable computer 106 may be programmed to generate test results in the form of graphical displays or representations that are indicative of the behavior of the connected actuator 102, and present the graphical displays or representations to the test operator via an output device 114 thereof. The test results may include information relating to the excitation signals 138 and command signals 140 that were issued by the actuator controller 104, the simulated feedback signals 142 that were output by the actuator simulator card 108, the actual response of the connected actuator 102, any errors or deviations that were detected between the simulated feedback signals 142 and the actual feedback signals 144, and the like.

It will be appreciated that the foregoing description provides examples of the disclosed apparatus, systems and methods. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated. All methods described herein can be performed in any suitable order unless otherwise indicated herein or otherwise clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An actuator simulator, comprising:
   a first interface configured to communicate with a programmable computer;
   a second interface configured to communicate with an actuator controller that is configurable to issue signals for operating a connected actuator; and
   a simulation module in communication with each of the first interface and the second interface, the simulation module being configured to:
   (i) receive at least one actuator simulation model including simulated responses and behaviors corresponding to at least one actuator from the first interface;
   (ii) receive, from the actuator controller via the second interface, excitation signals and command signals for invoking simulated feedback signals;
   (iii) determine the simulated feedback signals based on the excitation signals, the command signals, and the actuator simulation model; and
   (iv) transmit, via the second interface, the simulated feedback signals to the actuator controller for generation of test result information of the actuator controller based on the excitation signals, the command signals, and the simulated feedback signals.

2. The actuator simulator of claim 1, further comprising a third interface configured to communicate with the actuator, the simulation module being configured to receive actual feedback signals from the actuator in response to the excitation signals and the command signals, and transmit characterization data corresponding to the actual feedback signals and the simulated feedback signals to the programmable computer through the first interface.

3. The actuator simulator of claim 2, wherein the characterization data is configured to enable graphical views comparing actual actuator performance to theoretical actuator performance.

4. The actuator simulator of claim 1, wherein the actuator is a hydraulic actuator, the actuator simulation model is a preprogrammed model of a hydraulic actuator, and the actuator controller is a flight control computer.

5. The actuator simulator of claim 1, wherein the command signals include commands pertaining to at least one of a desired displacement and a desired rate of displacement, and the feedback signals include at least one of an actual displacement, an actual rate of displacement, and one or more error values.

6. An actuator simulation system, comprising:
   a programmable computer configured to source one or more of a plurality of actuator simulation models including simulated responses and behaviors corresponding to one or more actuators;
   an actuator controller configured to transmit excitation signals and command signals to a connected actuator; and
   an actuator simulator having a first interface for communicating with the programmable computer and a second interface for communicating with the actuator controller, the actuator simulator being configured to:
   (i) receive at least one actuator simulation model through the first interface:
   (ii) receive, from the actuator controller, the excitation signals and command signals through the second interface to invoke simulated feedback signals;

(iii) determine the simulated feedback signals based on the excitation signals, the command signals, and the actuator simulation model; and (iv) transmit, via the second interface, the simulated feedback signals to the actuator controller for generation of test result information of the actuator controller based on the excitation signals, the command signals, and the simulated feedback signals.

7. The actuator simulation system of claim 6, wherein the programmable computer is configured to monitor for defects in the actuator controller based on a response of the actuator controller to the simulated feedback signals.

8. The actuator simulation system of claim 7, wherein the programmable computer is configured to monitor for defects in the actuator controller pertaining to one or more of open outputs, shorted outputs, and low-voltage conditions.

9. The actuator simulation system of claim 6, wherein the actuator simulator includes a third interface for communicating with at least one actuator that is operatively coupled to the actuator controller and configured to generate actual feedback signals in response to the excitation signals and the command signals, the actuator simulator being configured to receive the actual feedback signals through the third interface and transmit characterization data corresponding to the actual feedback signals and the simulated feedback signals to the programmable computer through the first interface.

10. The actuator simulation system of claim 9, wherein the programmable computer is configured to receive the characterization data from the actuator simulator and generate graphical views comparing actual actuator performance to theoretical actuator performance.

11. The actuator simulation system of claim 9, wherein the programmable computer is configured to receive the characterization data from the actuator simulator and generate graphical views presenting failures detected in the actuator pertaining to one or more of actuator response, actuator temperature, and hydraulic pressure.

12. The actuator simulation system of claim 6, wherein the actuator controller includes a flight control computer having an operational flight program preprogrammed therein for controlling one or more hydraulic actuators, and the actuator simulator receives an actuator simulation model which corresponds to the one or more hydraulic actuators.

13. The actuator simulation system of claim 6, wherein the programmable computer is operatively coupled to the actuator controller and configured to control the actuator controller to issue the excitation signals and the command signals to the actuator simulator.

14. The actuator simulation system of claim 6, wherein the programmable computer is configured to provide a graphical user interface through which one or more of the actuator simulation models may be selected for use, and through which functionality of at least one of the actuator controller and the one or more actuators may be monitored.

15. A method of simulating an actuator, comprising:
providing a first interface for communicating with a programmable computer having one or more actuator simulation models preprogrammed therein;
providing a second interface for communicating with an actuator controller having an operational program installed therein, the actuator controller being configurable to issue signals for operating a connected actuator;
selecting at least one of the actuator simulation models corresponding to the actuator to be simulated;
operating the actuator controller to issue excitation signals and command signals to invoke simulated feedback signals;
determining the simulated feedback signals based on the excitation signals, the command signals, and the selected actuator simulation model; and
transmitting, via the second interface, the simulated feedback signals to the actuator controller for generation of test result information of the actuator controller based on the excitation signals, the command signals, and the simulated feedback signals.

16. The method of claim 15, further comprising:
monitoring the actuator controller for defects.

17. The method of claim 15, further comprising:
providing a third interface for communicating with the actuator;
receiving actual feedback signals from the actuator in response to the excitation signals and the command signals; and
generating characterization data corresponding to comparisons between the actual feedback signals and the simulated feedback signals.

18. The method of claim 17, wherein the characterization data is transmitted to the programmable computer through the first interface and used to generate a graphical user interface for testing the actuator.

19. The method of claim 15, wherein the command signals include commands pertaining to at least one of a desired displacement and a desired rate of displacement, and the feedback signals include at least one of an actual displacement, an actual rate of displacement, and one or more error values.

* * * * *